United States Patent
Chang et al.

(10) Patent No.: US 9,513,903 B2
(45) Date of Patent: Dec. 6, 2016

(54) FAULT-TOLERANT SYSTEM AND FAULT-TOLERANT OPERATING METHOD CAPABLE OF SYNTHESIZING RESULT BY AT LEAST TWO CALCULATION MODULES

(71) Applicant: Industrial Technology Research Institute, Hsinchu (TW)

(72) Inventors: Yung-Chang Chang, Taipei (TW); Hsing-Chuang Liu, Taoyuan County (TW); Chih-Jen Yang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 541 days.

(21) Appl. No.: 14/054,643

(22) Filed: Oct. 15, 2013

(65) Prior Publication Data
US 2014/0297995 A1 Oct. 2, 2014

(30) Foreign Application Priority Data
Mar. 29, 2013 (TW) .............................. 102111354 A

(51) Int. Cl.
*G06F 11/16* (2006.01)
*G06F 9/30* (2006.01)
(Continued)

(52) U.S. Cl.
CPC .......... *G06F 9/3001* (2013.01); *G06F 11/165* (2013.01); *G06F 11/1608* (2013.01); *G06F 11/1629* (2013.01); *G06F 11/183* (2013.01); *H03K 19/0033* (2013.01); *G06F 11/1497* (2013.01); *G06F 11/1641* (2013.01); *G06F 11/188* (2013.01)

(58) Field of Classification Search
CPC ..... G06F 11/165; G06F 11/16; G06F 11/1608; G06F 11/1629; G06F 11/1641; G06F 9/00–9/3897
(Continued)

(56) References Cited

U.S. PATENT DOCUMENTS

| | | | |
|---|---|---|---|
| 5,812,757 | A | 9/1998 | Okamoto et al. |
| 6,035,416 | A | 3/2000 | Abdelnour et al. |

(Continued)

FOREIGN PATENT DOCUMENTS

| | | |
|---|---|---|
| EP | 0752656 | 1/1997 |
| TW | 200903318 | 1/2009 |
| TW | I367422 | 7/2012 |

OTHER PUBLICATIONS

Taiwan Patent Office, Office Action, Patent Application Serial No. 102111354, Oct. 29, 2014, Taiwan.
(Continued)

*Primary Examiner* — Keith Vicary

(57) ABSTRACT

A fault-tolerant system including a calculation unit and an output synthesizer is provided. The calculation unit receives a first environmental parameter and input data, wherein the calculation unit further includes a first and a second calculation circuits. The first calculation circuit is arranged to perform a calculation on the input data in response to the first environmental parameter to generate a first calculation result. The second calculation circuit is different from the first calculation circuit, and arranged to perform the calculation on the input data in response to the first environmental parameter to generate a second calculation result. The output synthesizer selects a first and a second set of bits from the first and the second calculation result according to a control signal, and synthesizes the first set of bits and the second set of bits in sequence to generate an adjusted calculation result.

15 Claims, 14 Drawing Sheets

(51) Int. Cl.
  *G06F 11/18* (2006.01)
  *H03K 19/003* (2006.01)
  *G06F 11/14* (2006.01)

(58) Field of Classification Search
  USPC .......................................................... 714/11
  See application file for complete search history.

(56) References Cited

U.S. PATENT DOCUMENTS

| | | | |
|---|---|---|---|
| 6,092,217 | A | 7/2000 | Kanekawa et al. |
| 6,708,284 | B2* | 3/2004 | Smith .................... G06F 11/10 714/10 |
| 7,137,036 | B2 | 11/2006 | Urahama |
| 7,395,393 | B2 | 7/2008 | Shiraki et al. |
| 7,516,358 | B2* | 4/2009 | Haefliger ................ G06F 11/24 700/186 |
| 7,853,824 | B2 | 12/2010 | Tai |
| 7,865,770 | B2* | 1/2011 | Quach ................ G06F 9/30189 714/11 |
| 8,146,028 | B1 | 3/2012 | Lesea |
| 2006/0190700 | A1* | 8/2006 | Altman ............... G06F 11/1641 712/7 |
| 2006/0236168 | A1 | 10/2006 | Wolfe et al. |
| 2008/0155321 | A1* | 6/2008 | Riedlinger ............ G06F 1/3203 714/17 |
| 2009/0044049 | A1* | 2/2009 | Luick .................. G06F 9/30101 714/11 |
| 2010/0131741 | A1 | 5/2010 | Yamada et al. |
| 2013/0205169 | A1* | 8/2013 | Gaither ............... G06F 11/2041 714/11 |
| 2014/0115425 | A1* | 4/2014 | Camalig ................ G11B 5/607 714/769 |
| 2014/0156975 | A1* | 6/2014 | Sridharan ........... G06F 11/1641 712/227 |

OTHER PUBLICATIONS

Kahng, A.B. et al., "Designing a processor from the ground up to allow voltage/reliability tradeoffs," IEEE High Performance Computer Architecture (HPCA), Jan. 2010, pp. 1-11, IEEE, US.

M.Bellottia et al., "How future automotive functional safety requirements will impact microprocessors design," 21st European Symposium on the Reliablilty of Electron Devices, Failure Physics and Analysis, Nov. 2010, pp. 1320-1326, Elsevier, US.

Yang Liu et al., "Computation Error Analysis in Digital Signal Processing Systems With Overscaled Supply Voltage," IEEE Transactions on VLSI, Apr. 2010,pp. 517-526, vol. 18, No. 4, IEEE, US.

Kim, E.P et al., "Soft N-Modular Redundancy," IEEE Transactions on Computers, Mar. 2012, pp. 323-336, vol. 61, No. 3, IEEE, US.

Whatmough P.N. et al., "Error-resilient low-power DSP via path-delay shaping," Design Automation Conference (DAC), Jun. 2011, pp. 1008-1013, IEEE, US.

Avirneni, N.D.P et al., "Low Overhead Soft Error Mitigation Techniques for High-performance and Aggressive Designs," IEEE Transactions on Computers, Apr. 2012, pp. 488-501, vol. 61, No. 4, IEEE, US.

Paul N.Whatmough et al., "Circuit-Level Timing Error Tolerance for Low-Power DSP Filters and Transforms," IEEE Transactions on VLSI systems, Jun. 2013, pp. 989-999, vol. 21, No. 6,, IEEE, US.

* cited by examiner

FAULT-TOLERANT SYSTEM AND FAULT-TOLERANT OPERATING METHOD CAPABLE OF SYNTHESIZING RESULT BY AT LEAST TWO CALCULATION MODULES

CROSS REFERENCE TO RELATED APPLICATION

The present application is based on, and claims priority from, Taiwan(International) Application Serial Number 102111354, filed Mar. 29, 2013, the disclosure of which is hereby incorporated by reference herein in its entirety.

TECHNICAL FIELD

The technical field relates to a fault-tolerant system and fault-tolerant operating method.

BACKGROUND

A detailed description is given in the following embodiments with reference to the accompanying drawings.

Presently, electronic devices are highly developed and multi-functional. For example, many electronic devices are capable of image processing, audio processing, data coding, data decoding, and other functions and operations. Therefore, the accuracy of calculations by electronic devices may become critical for vehicle chips and high-reliability chips.

However, the accuracy of the calculations performed by electronic devices is related to the environment. For example, a circuit might output different results based on different voltage supplies and temperatures, wherein the results have different levels of accuracy. Therefore, chips to output the correct result in different environments may be in need.

SUMMARY

A detailed description is given in the following embodiments with reference to the accompanying drawings.

An exemplary embodiment provides a fault-tolerant system. The fault-tolerant system includes a calculation unit and an output synthesizer. The calculation unit is arranged to receive a first environmental parameter and input data, wherein the calculation unit further includes a first calculation module and a second calculation module. The first calculation module includes a first calculation circuit arranged to perform a calculation on the input data in response to the first environmental parameter to generate a first calculation result, wherein the first calculation result is constituted by a plurality of first output bits, and each of the first output bits has a corresponding bit position. The second calculation module includes a second calculation circuit different from the first calculation circuit, and the second calculation circuit is arranged to perform the calculation on the input data in response to the first environmental parameter to generate a second calculation result, wherein the second calculation result is constituted by a plurality of second output bits, and each of the second output bits has a corresponding bit position. The output synthesizer is arranged to select a first set of bits from the first output bits and a second set of bits from the second output bits according to a control signal, and synthesize the first set of bits and the second set of bits in sequence according to the corresponding bit positions of the first set of bits in the first output bits and the second set of bits in the second output bits to generate an adjusted calculation result.

Another exemplary embodiment provides a fault-tolerant operating method applied for a fault-tolerant system. The fault-tolerant operating method includes: performing a calculation on input data in response to a first environmental parameter to generate a first calculation result by a first calculation circuit, wherein the first calculation result is constituted by a plurality of first output bits, and each of the first output bits has a corresponding bit position; performing the calculation on the input data in response to the first environmental parameter to generate a second calculation result by a second calculation circuit which is different from the first calculation circuit, wherein the second calculation result is constituted by a plurality of second output bits, and each of the second output bits has a corresponding bit position; selecting a first set of bits from the first output bits and a second set of bits from the second output bits according to a control signal; and synthesizing the first set of bits and the second set of bits in sequence according to the corresponding bit positions of the first set of bits in the first output bits and the second set of bits in the second output bits to generate an adjusted calculation result.

BRIEF DESCRIPTION OF DRAWINGS

The present disclosure can be more fully understood by reading the subsequent detailed description and examples with references made to the accompanying drawings, wherein.

DETAILED DESCRIPTION

Figure 1:
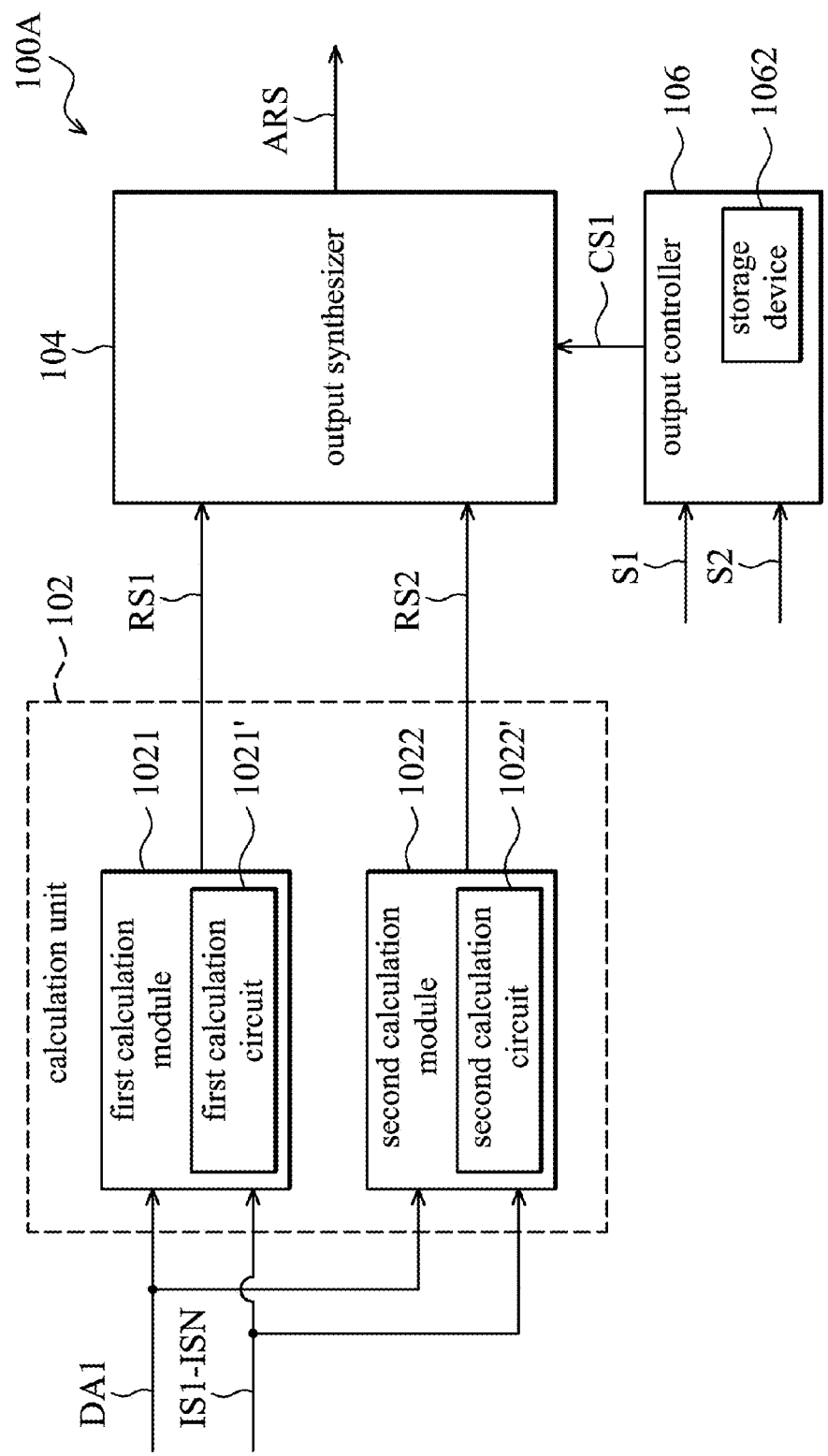
FIG. 1 is a schematic view of a fault-tolerant system according to an exemplary embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic view of a fault-tolerant system according to an exemplary embodiment. The fault-tolerant system 100A includes a calculation unit 102, an output synthesizer 104 and an output controller 106. The fault-tolerant system 100A can be implemented on computer systems and/or a computer configuration with calculating chips, such as a vehicle computer, desktop, hand-held device, multiprocessing system, Mini computer, tablet, etc., but it is not limited thereto.

The calculation unit 102 is arranged to receive one of a plurality of instructions IS1-ISN- and input data DA1, and operate in response to one of a plurality of environmental parameters. For example, the instructions IS1-ISN can represent combinations of addition, subtraction, multiplication and/or division, and the environmental parameters can represent operation voltages with different voltage levels, operation temperatures with different degrees, and/or the clock signals with different speed provided to the calculation unit 102, wherein the instructions IS1-ISN and the environmental parameters are provided to the calculation unit 102 for calculation, but are not limited thereto. For purposes of simplifying the descriptions of the embodiments, hereinafter one of the instructions IS1-ISN which is received by the calculation unit 102 is referred to as the first instruction. One of the environmental parameters which is affecting the calculation unit 102 is referred to as the first environmental parameter. The calculation unit 102 further includes a first calculation module 1021 and a second calculation module 1022. The first calculation module 1021 has a first calculation circuit 1021' arranged to perform a calculation on the input data DA1 according to the first instruction and in response to the first environmental parameter to generate a first calculation result RS1, wherein the first calculation result RS1 is constituted by a plurality of first output bits, and each of the first output bits has a corresponding bit position. In another embodiment, the first calculation circuit 1021' of the first calculation module 1021 can perform the calculation on the input data DA1 in response to the first environmental parameter to generate a first calculation result RS1 without the first instruction. The second calculation module 1022 has a second calculation circuit 1022' different from the first calculation circuit 1021', and the second calculation circuit 1022' is arranged to perform the calculation on the input data DA1 according to the first instruction and in response to the first environmental parameter to generate a second calculation result RS2. Furthermore, the second calculation result RS2 is constituted by a plurality of second output bits, and each of the second output bits has a corresponding bit position. In another embodiment, the second calculation circuit 1022' of the second calculation module 1022 can perform the calculation on the input data DA1 in response to the first environmental parameter to generate a second calculation result RS2 without the first instruction. Namely, the calculation unit 102 includes two different calculation modules which are the first calculation module 1021 and the second calculation module 1022. Namely, the first calculation module 1021 and the second calculation module 1022 apply different hardware circuits to perform the calculation indicated by the first instruction on the input data DA1 in response to the first environmental parameter. For example, the implementations of the first calculation module 1021 and the second calculation module 1022 are different. In another embodiment, the first calculation module 1021 and the second calculation module 1022 can also apply different circuits to perform the calculation indicated by the first instruction on the input data DA1 in response to the first environmental parameter, but it is not limited thereto. The first calculation module 1021 and the second calculation module 1022 can further include a storage device (not shown). The storage device may include a read only memory (ROM), a flash ROM and/or a random access memory (RAM) arranged to store the first calculation result RS1 and the second calculation result RS2 generated by the first calculation circuit 1021' and the second calculation circuit 1022'.

The output synthesizer 104 is arranged to select a first set of bits from the first output bits and a second set of bits from the second output bits according to a control signal CS1, and synthesize the first set of bits and the second set in sequence according to the corresponding bit positions of the first set of bits in the first output bits and the second set of bits in the second output bits to generate an adjusted calculation result ARS. The first calculation result RS1, the second calculation result RS2 and the adjusted calculation result ARS have the same number of bits, and the corresponding bit positions of the first set of bits in the first output bits are different from the corresponding bit positions of the second set of bits in the second output bits.

The output controller 106 is arranged to receive the determination signal S1 arranged to represent the first instruction and the determination signal S2 arranged to represent the first environmental parameter, but it is not limited thereto. In other embodiments, the output controller 106 can receive more than three determination signals. For example, different determination signals represent different environmental parameters,instructions, etc. Moreover, the output controller 106 is further arranged to generate the control signal CS1 according to the first instruction, the first environmental parameter, a first circuit-characteristics table of the first calculation circuit 1021' and a second circuit-characteristics table of the second calculation circuit 1022', and transmit the control signal CS1 to the output synthesizer 104. Namely, the control signal CS1 is determined according to the operation voltages, the operation temperatures, the clock speed, the received instructions (i.e. first instruction) and/or the circuit characteristics, but it is not limited thereto. The output controller 106 further includes a storage device 1062. The storage device 1062 is arranged to store the first circuit-characteristics table and the second circuit-characteristics table, wherein the first circuit-characteristics table is arranged to record the relationship of each bit position output by the first calculation circuit 1021', the environmental parameters and the instructions IS1-ISN, and the second circuit-characteristics table is arranged to record the relationship of each bit position output by the second calculation circuit 1022', the environmental parameters and the instruction IS1-ISN. In one embodiment, the first circuit-characteristics table is arranged to record the accuracies of each bit position output by the first calculation circuit 1021' with the environmental parameters and the instructions IS1-ISN, and the second circuit-characteristics table is arranged to record the accuracies of each bit position output by the second calculation circuit 1022' with the environmental parameters and the instruction IS1-ISN, but it is not limited thereto. In one of the embodiments, the output controller 106 is arranged to select the first output bits or the second output bits for each bit position according to the first instruction and the first environmental parameter to produce the control signal CS1, wherein the output controller 106 is arranged to select the first output bits or the second output bits with the higher accuracy based on the first circuit-characteristics table and the second circuit-characteristics table.

Namely, the first calculation circuit 1021' outputs the first output bits by a plurality of pins to constitute the first calculation result RS1 after performing the calculation. The first output bits output by the pins are arranged to serve as the bits of the first calculation result RS1 in sequence to constitute the first calculation result RS1, wherein the first output bits output by the different pins might have different accuracies from each other, and have different accuracies with different environmental parameters and different instructions IS1-ISN. Similarly, the second calculation circuit 1022' outputs the second output bits by a plurality of pins to constitute the second calculation result RS2 after performing the calculation. The second output bits output by the pins are arranged to serve as the bits of the second calculation result RS2 in sequence to constitute the second calculation result RS2, wherein the second output bits output by the different pins might have different accuracies from each other, and have different accuracies with different environmental parameters and different instructions IS1-ISN. Therefore, the developer can obtain the accuracies of each of the bits output by the first calculation circuit 1021' corresponding to the different environmental parameters and the different instructions IS1 -ISN by testing the first calculation circuit 1021' repeatedly according to the different environmental parameters and the different instructions IS1-ISN for producing the first circuit-characteristics table accordingly. Similarly, the developer can obtain the accuracies of each of the bits output by the second calculation circuit 1022' corresponding to the different environmental parameters and the different instructions IS1-ISN by testing the second calculation circuit 1022' repeatedly according to the different environmental parameters and the different instructions IS1-ISN for producing the second circuit characteristics table accordingly.

Figure 2A:
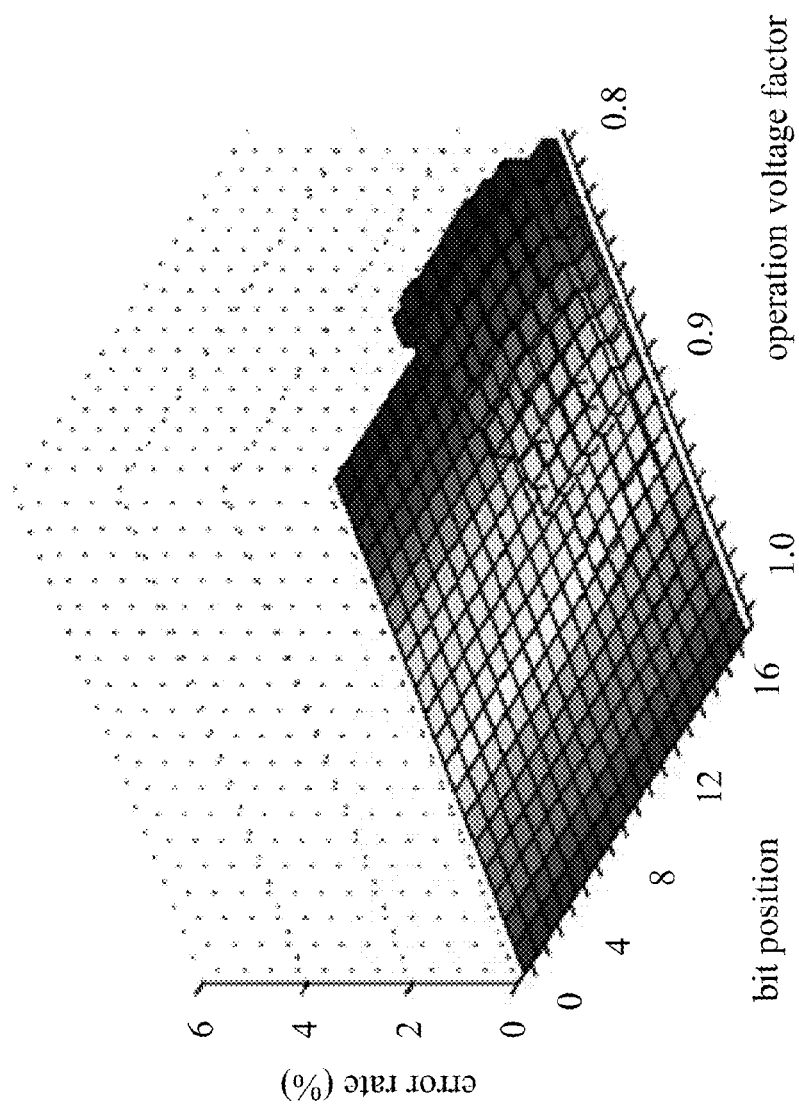
FIG. 2A is a simulation diagram of a calculation circuit according to an exemplary embodiment.
Figure 2B:
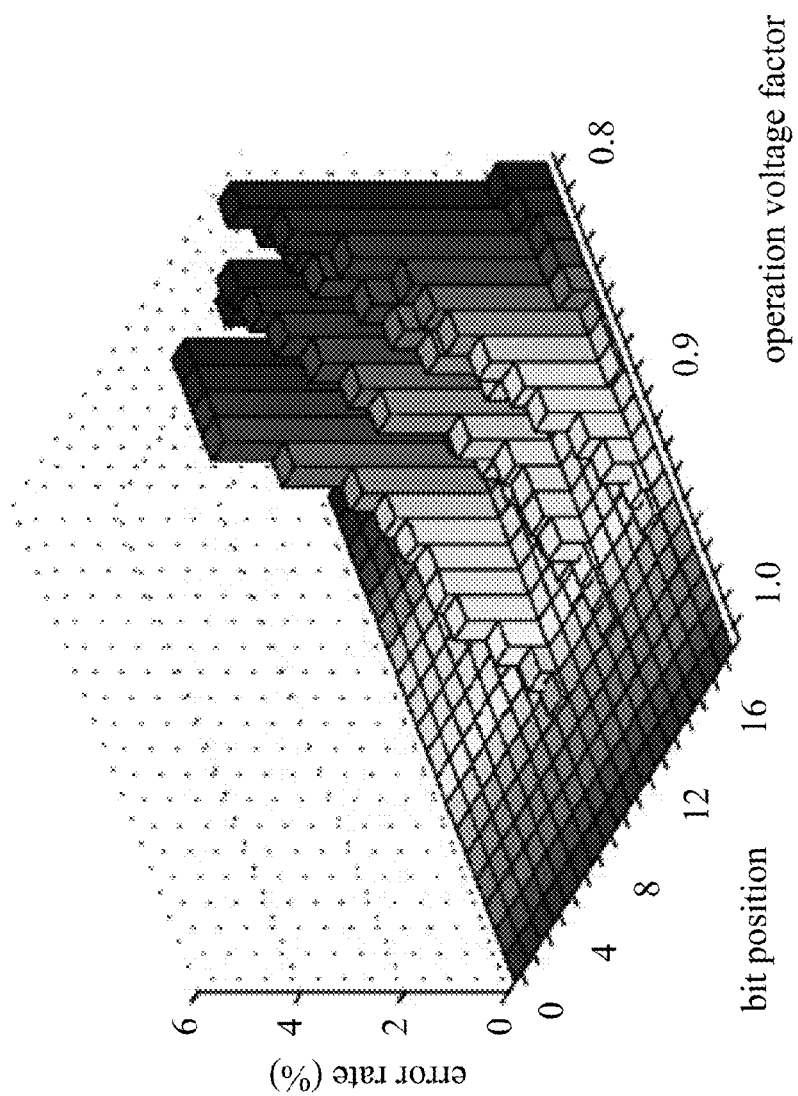
FIG. 2B is a simulation diagram of a calculation circuit according to another exemplary embodiment.
Figure 2C:
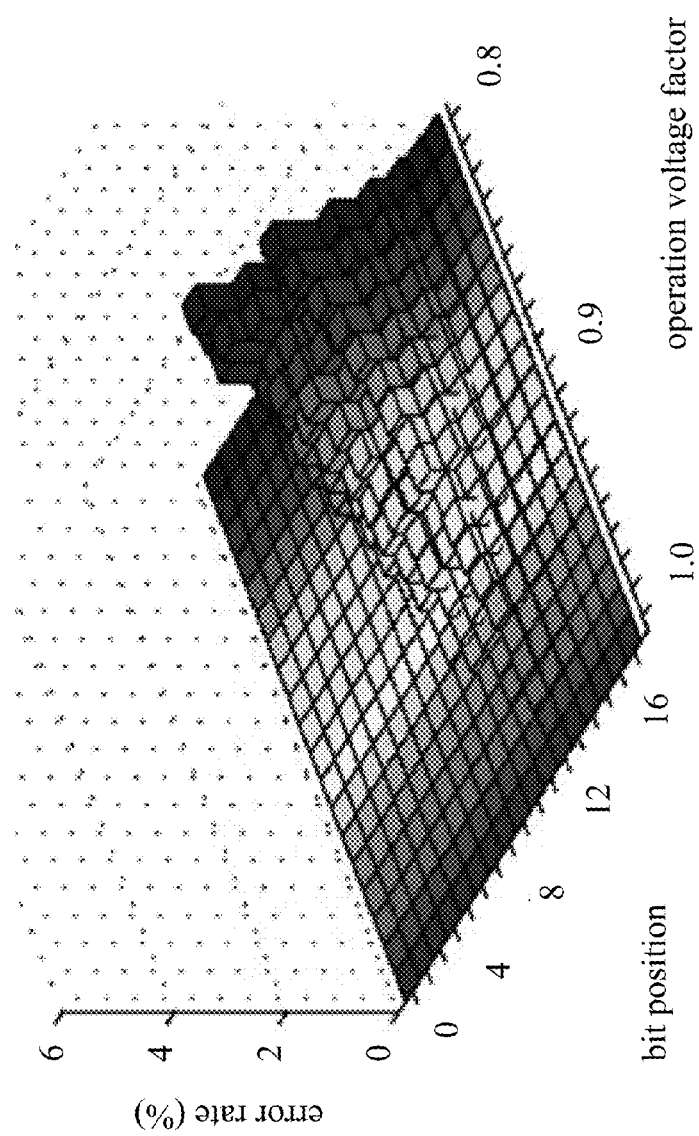
FIG. 2C is a simulation diagram of a calculation circuit according to another exemplary embodiment.

For example, the first calculation circuit 1021' and the second calculation circuit 1022' may include a carry-ripple adder (CRA), a carry-look ahead adder (CLA) or a carry select adder (CSA), but it is not limited thereto. FIGS. 2A-2C are simulation diagrams of "Computation Error Analysis in Digital Signal Processing Systems With Overscaled Supply Voltage" published on IEEE TRANSACTIONS ON VERY LARGE SCALE INTEGRATION SYSTEMS, VOL. 18, NO. 4, APRIL 2010. As the simulation diagram of a carry-ripple adder shown in FIG. 2A, the higher bit positions of the carry-ripple adder have a higher error rate at a low operation voltage. As the simulation diagram of a carry-look ahead adder in FIG. 2B shows, some bit positions of the carry-look ahead adder have a higher error rate at a low operation voltage. As seen in the simulation diagram of a carry select adder shown in FIG. 2C, the middle bit positions of the carry select adder have a higher error rate at a low operation voltage. In FIGS. 2A-2C, the first axis represents bit positions, the second axis represents factors of the operating voltages, and the third axis represents error rates. In other embodiments, the third axis may be accuracies. For example, the accuracies are equal to one hundred percent minus the corresponding error rates. In another embodiment, the accuracies can be obtained by directly measuring the bits at different voltages. Therefore, the accuracies of each bit position corresponding to the different environmental parameters can be obtained by the data shown in FIGS. 2A-2C, and the first circuit-characteristics table and the second circuit-characteristics table can be produced according to the data.

Figure 3:
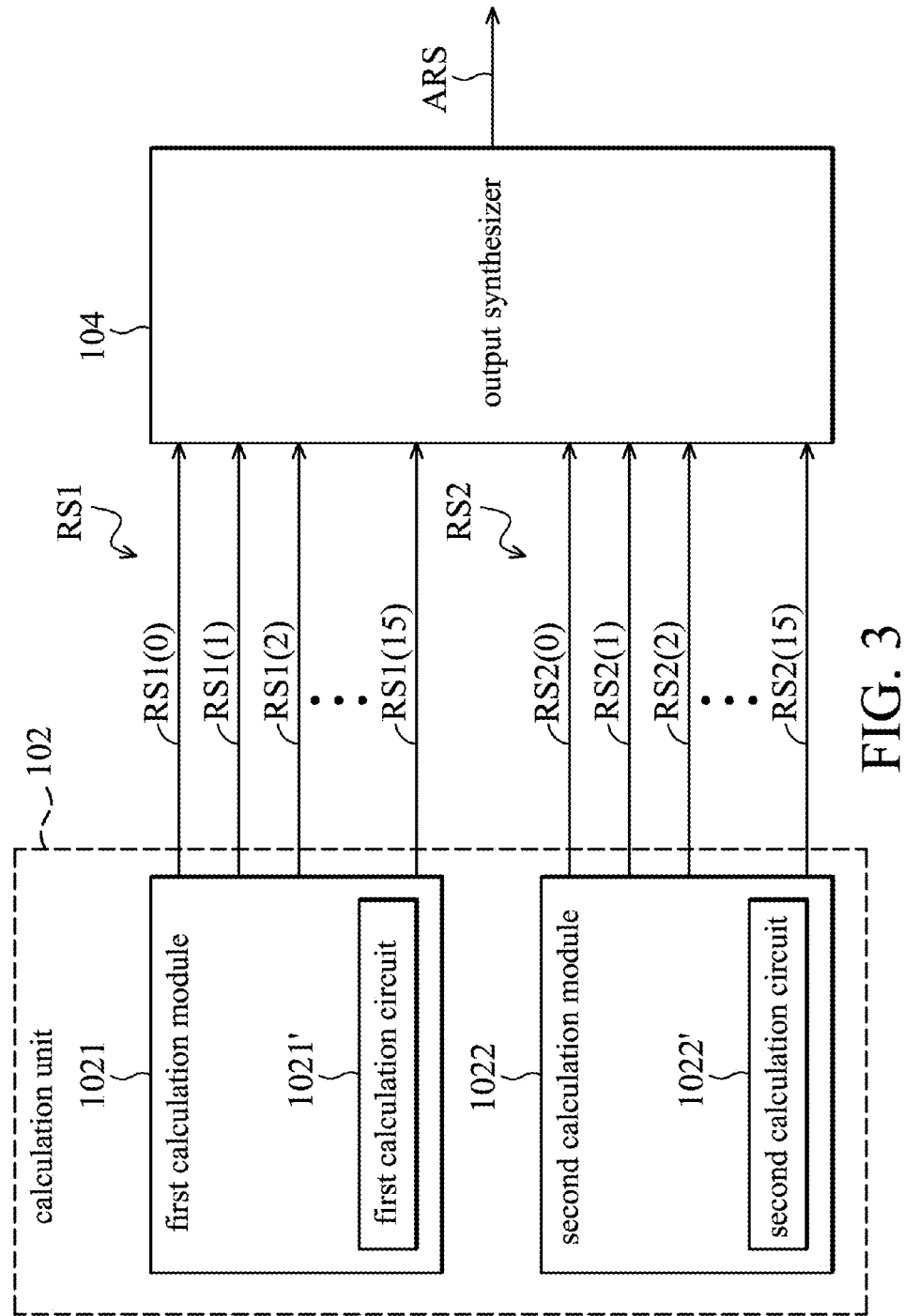
FIG. 3 shows an example of the calculation of a fault-tolerant system according to an exemplary embodiment.

For example, the first calculation circuit 1021' includes the carry-ripple adder corresponding to FIG. 2A and the second calculation circuit 1022' includes the carry select adder corresponding to FIG. 2C. When the first instruction indicates an addition calculation and the first operation voltage is 0.85 times of the supplying voltage, the carry-ripple adder of the first calculation circuit 1021' performs the addition calculation on the input data DA1 and generates the first calculation result RS1 accordingly, wherein the first calculation result RS1 is constituted by the first output bit RS1(0) having a first predetermined bit position, the first output bit RS1(1) having a second predetermined position and the first output bits RS1(2)-RS1(15) having the third to the sixteenth predetermined bit positions, as FIG. 3 shows. The first operation voltage is 0.85 times 1.2 Volts when the operation voltage is 1.2 Volts, and the first operation voltage is 0.85 times 0.9 Volts when the operation voltage is 0.9 Volts, and so on, though it is not limited thereto. Moreover, the carry select adder of the second calculation circuit 1022' performs the addition calculation on the input data DA1 to generate the second calculation result RS2, where the second calculation result RS2 is constituted by the second output bits RS2(0) having the first predetermined bit positions, the second output bits RS2(1) having the second predetermined bit positions and the second output bits RS2(2)-RS2(15) having the third to the predetermined sixteenth bit positions, as shown in FIG. 3, although it is not limited thereto. For example, the first calculation result RS1 and the second calculation result RS2 can be more than or less than 16 bits.

Next, as shown in FIG. 1, the output controller 106 is arranged to select the first output bits or the second output bits with the higher accuracy based on the first circuit characteristics table and the second circuit-characteristics table in response to the first instruction indicating the addition calculation and the 0.85 factor of the first operation voltage for producing the control signal CS1. For example, the output controller 106 selects the second output bits RS2(0)-RS2 (9) corresponding to the first to tenth predetermined bit positions, first output bits RS1(10) -RS1(12) corresponding to the eleventh to thirteenth predetermined bit positions, and second output bits RS2(13)-RS2(15) corresponding to the fourteenth to sixteenth predetermined bit positions with the higher accuracies at each bit position. Next, the output controller 106 produces the control signal CS1, and transmits the control signal CS1 to the output synthesizer 104. The output synthesizer 104 selects a first set of bits from the first output bits and a second set of bits from the second output bits according to the control signal CS1, and synthesizes the first set of bits and the second set of bits in sequence according to the corresponding bit positions of the first set of bits in the first output bits and the second set of bits in the second output bits to generate an adjusted calculation result ARS. Namely, the output synthesizer 104 selects the first output bits RS1(10)-RS1(12) from RS1(0)-RS1(15) as the first set of bits, and selects the second output bits RS2(0)-RS2(9) and RS2(13)-RS2(15) from RS2(0)-RS2 (15) as the second set of bits according to the control signal CS1. Next, the output synthesizer 104 synthesizes the second output bits RS2(0)-RS2 (9), the first output bits RS1 (10)-RS1(12) and the second output bits RS2(13)-RS2(15) of the first set of bits and the second set of bits to generate the adjusted calculation result ARS. Namely, the adjusted calculation result ARS is constituted by the output bits (RS2(0), RS2(1), RS2(2), RS2(3), RS2(4), RS2(5), RS2(6), RS2(7), RS2(8), RS2(9), RS1(10), RS1(11), RS1(12), RS2 (13), RS2(14), RS2(15)) in sequence from the lowest bit position to the highest bit position, but it is not limited thereto.

In another embodiment, the output controller 106 produces the control signal CS1 according to the first instruction indicating the addition calculation and 0.85 factor of the first operation voltage, and transmits the control signal CS1 to the output synthesizer 104. Namely, the control signal CS1 includes information about the first instruction and the first environmental parameter. The output synthesizer 104 selects the first output bits or the second output bits with the higher accuracy according to the first circuit-characteristics table and the second circuit-characteristics table for each of the bit positions in response to the control signal CS1 to serve as the first set of bits and the second set of bits. For example, the output synthesizer 104 selects the second output bits RS2(0)-RS2(9) corresponding to the first to tenth predetermined bit positions, the first output bits RS1(10)-RS1(12) corresponding to the eleventh to thirteenth predetermined bit positions and the second output bits RS2(13)-RS2(15) corresponding to the fourteenth to the sixteenth predetermined bit positions. Namely, the output synthesizer 104 selects the first output bits RS1(10)-RS1(12) as the first set of bits, and second output bits RS2(0)-RS2(9) and second output bits RS2(13)-RS2(15) as the second set of bits.

Figure 4:
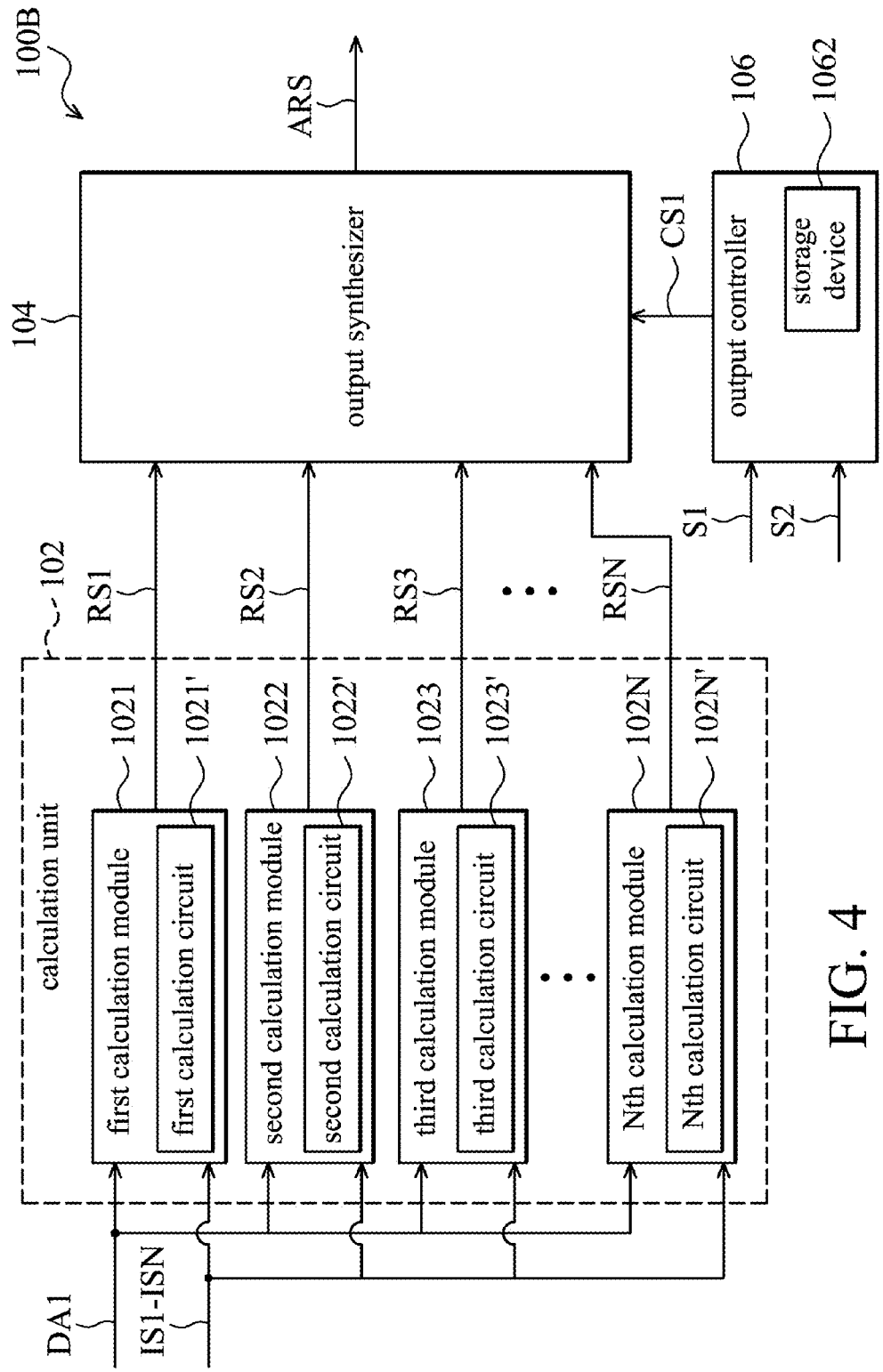
FIG. 4 is a schematic view of a fault-tolerant system according to another exemplary embodiment.

FIG. 4 is a schematic view of a fault-tolerant system according to another exemplary embodiment. The fault-tolerant system 100B is similar to the fault-tolerant system 100A shown in FIG. 1, and the calculation unit 102 of the fault-tolerant system 100B further includes the third calculation module 1023~Nth calculation module 102N. Similarly, the first calculation module 1021~the Nth calculation module 102N includes the first calculation circuit 1021'~the Nth calculation circuit 102N' that are different from each other, and the first calculation circuit 1021'~the Nth calculation circuit 102N' are arranged to perform the calculation on the input data DA1 according to the first instruction received by the calculation unit 102, and generate the first calculation result RS1~the Nth calculation result RSN, respectively. The output controller 106 is further arranged to produce the control signal CS1 according to the first instruction, the first environmental parameter and the first circuit-characteristics table~the Nth circuit-characteristics table of the first calculation circuit 1021'~the Nth calculation circuit 102N', and transmit the control signal CS1 to the output synthesizer 104. Next, the output synthesizer 104 is arranged to select the output bits with higher accuracy from the first calculation result RS1~the Nth calculation result RSN at each bit position according to the control signal CS1. The other details can be referred to in the descriptions of FIGS. 1-3.

Figure 5:
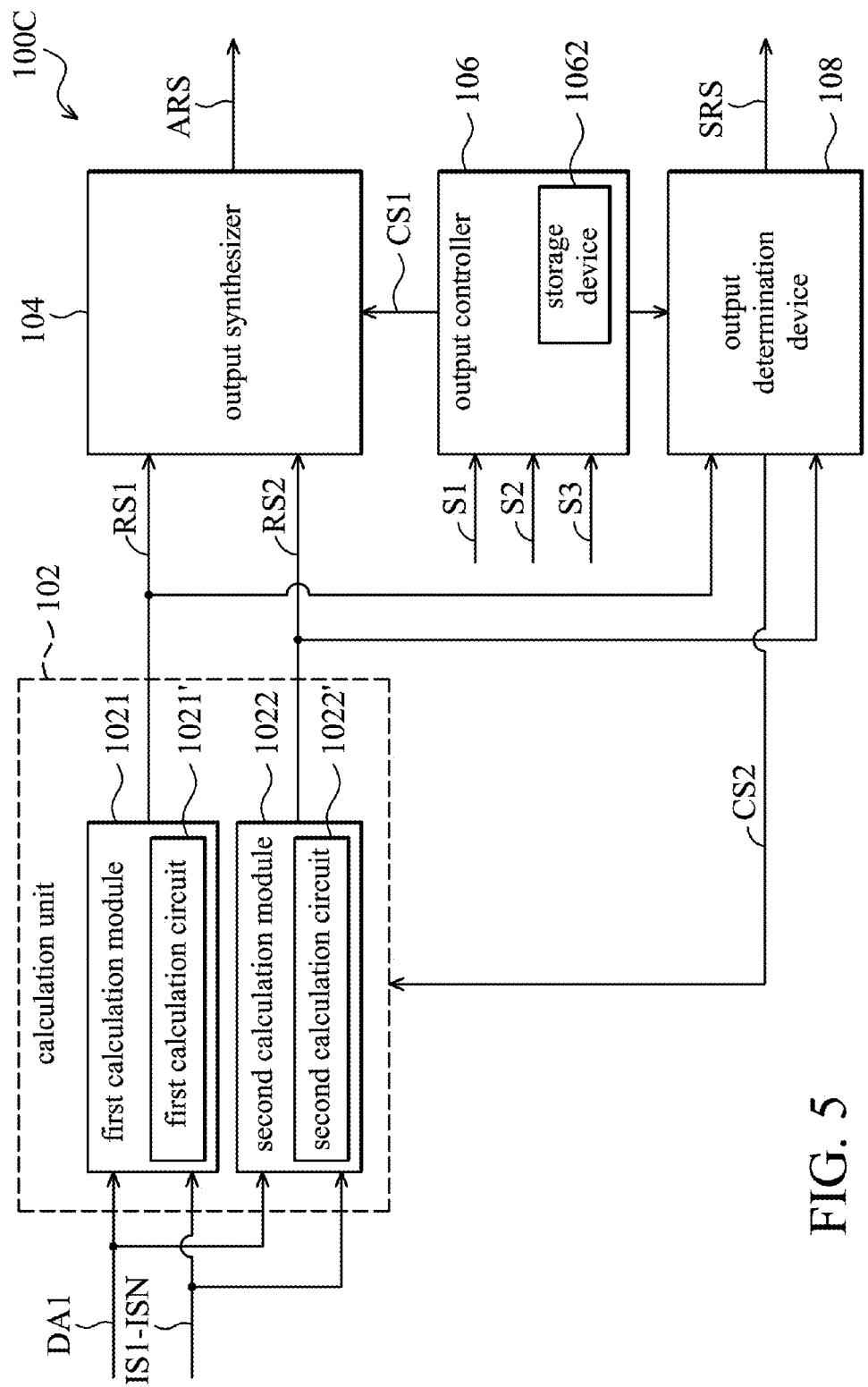
FIG. 5 is a schematic view of a fault-tolerant system according to another exemplary embodiment.

FIG. 5 is a schematic view of a fault-tolerant system according to another exemplary embodiment. The fault-tolerant system 100C is similar to the fault-tolerant system 100A of FIG. 1, and that the fault-tolerant system 100C further includes an output determination device 108 and the output controller 106 is further arranged to receive the determination signal S3 which represents the operation mode.

In this embodiment, the output controller 106 is further arranged to enable the output synthesizer 104 or the output determination device 108 according to the determination signal S3 indicating the operation mode, wherein the operation mode includes a first mode and a second mode. In one of the embodiments, the first mode is a normal operation mode and the second mode is a digital processing mode (DSP). When the operation mode is the normal operation mode, the output controller 106 enables the output determination device 108 to generate the selected calculation result SRS, or it enables the calculation unit 102 to perform the calculation again. When the operation mode is the digital processing mode, the output controller 106 enables the output synthesizer 104 to generate the adjusted calculation result ARS.

The output determination device 108 is arranged to compare the first calculation result RS1 and the second calculation result RS2. When the first calculation result RS1 and the second calculation result RS2 are not equal, the output determination device 108 enables the first calculation module 1021 and the second calculation module 1022 to perform the calculation on the input data DA1 according to the first instruction again. For example, when the first calculation result RS1 and the second calculation result RS2 are not equal, the output determination device 108 produces a control signal CS2, and transmits the control signal CS2 to the calculation unit 102. The first calculation module 1021 and the second calculation module 1022 of the calculation unit 102 perform the calculation on the input data DA1 according to the first instruction again after receiving the control signal CS2. When the first calculation result RS1 and the second calculation result RS2 are equal, the output determination device 108 outputs the first calculation result RS1 or the second calculation result RS2 as the selected calculation result SRS. The details of the digital processing mode can be referred to in the descriptions of FIGS. 1-3.

Figure 6:
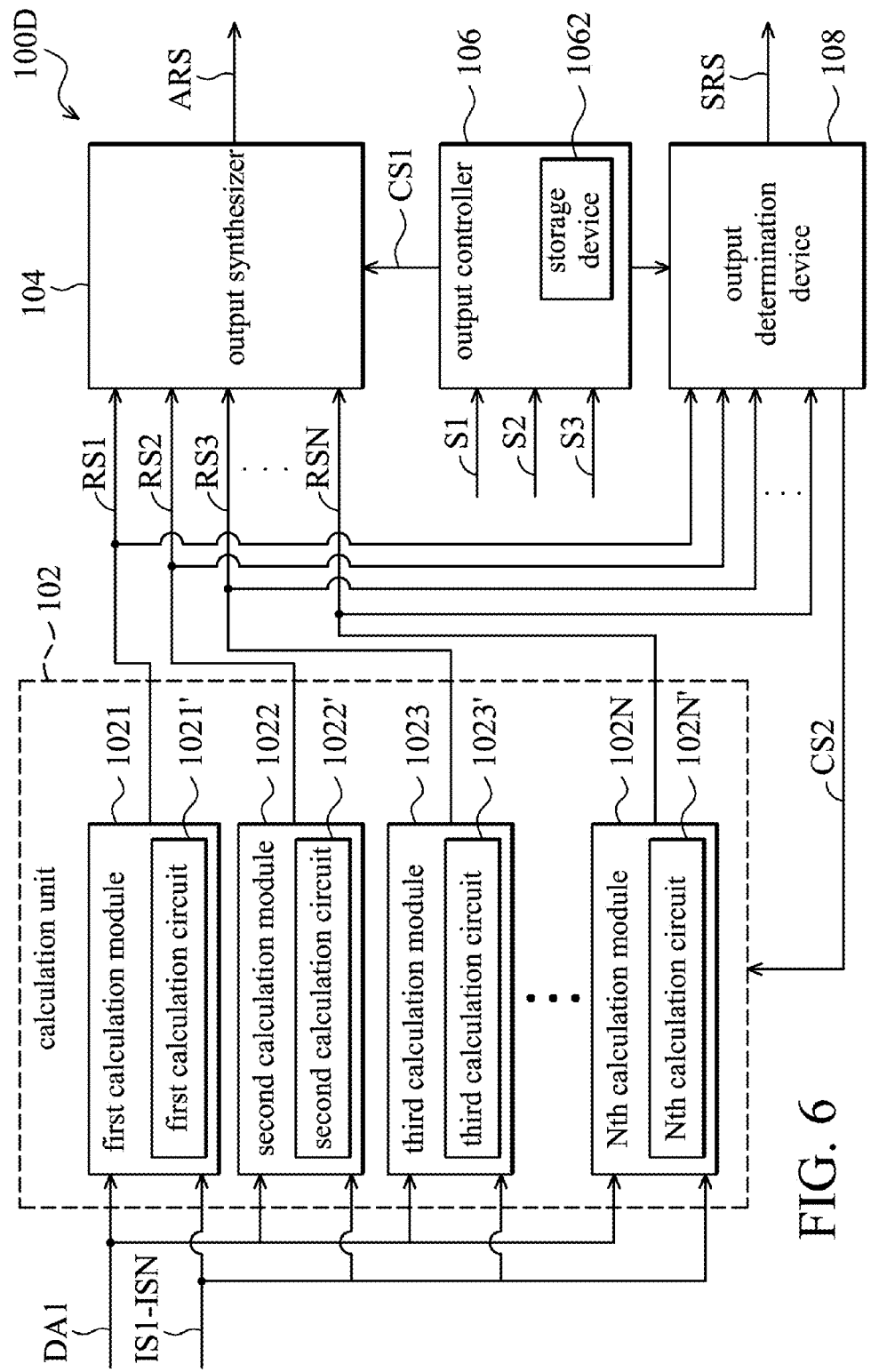
FIG. 6 is a schematic view of a fault-tolerant system according to another exemplary embodiment.

FIG. 6 is a schematic view of a fault-tolerant system according to another exemplary embodiment. The fault-tolerant system 100D is similar to the fault-tolerant system 100B of FIG. 4, and that the fault-tolerant system 100D further includes an output determination device 108, and the output controller 106 is further arranged to receive the determination signal S3 which represents the operation mode.

In this embodiment, the output controller 106 is further arranged to enable the output synthesizer 104 or the output determination device 108 according to the determination signal S3 indicating the operation mode, wherein the operation mode includes a first mode and a second mode. The first mode is a normal operation mode and the second mode is a digital processing mode (DSP). When the operation mode is the normal operation mode, the output controller 106 enables the output determination device 108 to generate the selected calculation result SRS or enables the calculation unit 102 to perform the calculation again. When the operation mode is the digital processing mode, the output controller 106 enables the output synthesizer 104 to generate the adjusted calculation result ARS.

The output determination device 108 is arranged to compare the first calculation result RS1~the Nth calculation result RSN. When the first calculation result RS1~the Nth calculation result RSN are not equal, the output determination device 108 enables the first calculation module 1021~the Nth calculation module 102N to perform the calculation on the input data DA1 according to the first instruction again. For example, when the first calculation result RS1~the Nth calculation result RSN are not equal, the output determination device 108 produces a control signal CS2, and transmits the control signal CS2 to the calculation unit 102. The first calculation module 1021~the Nth calculation module 102N of the calculation unit 102 perform the calculation on the input data DA1 according to the first instruction again after receiving the control signal CS2. When the first calculation result RS1~the Nth calculation result RSN are equal, the output determination device 108 outputs one of the first calculation result RS1~the Nth calculation result RSN, as the selected calculation result SRS. The details of the digital processing mode can be referred to in the descriptions in FIG. 4. In another embodiment, when the first calculation result RS1~the Nth calculation result RSN are not equal, the first calculation module1021~the Nth calculation module 102N are arranged to perform the calculation on the input data DA1 without receiving the first instruction.

Figure 7:
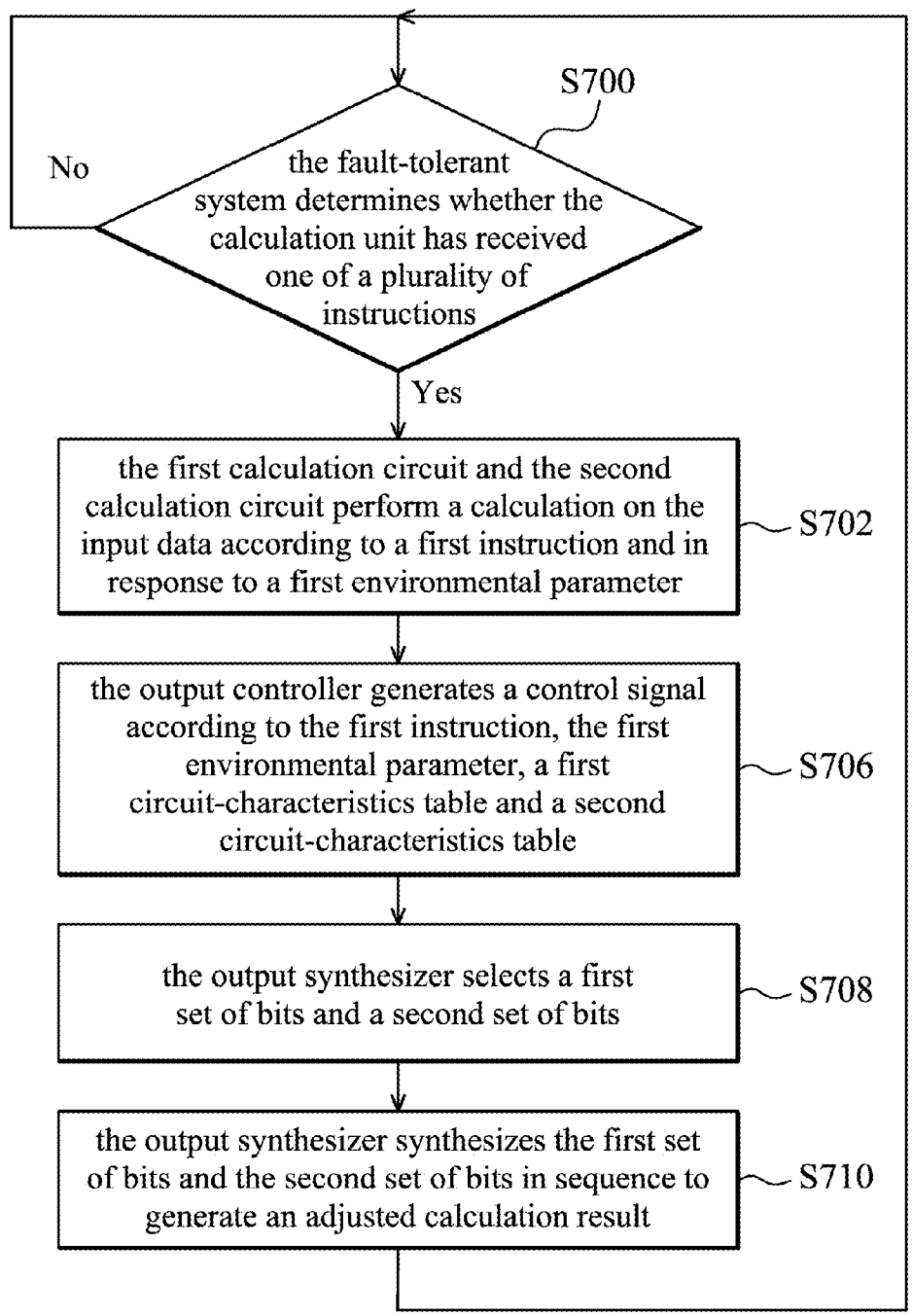
FIG. 7 is a flowchart of a fault-tolerant operating method according to an exemplary embodiment.

FIG. 7 is a flowchart of a fault-tolerant operating method according to an exemplary embodiment, wherein the fault-tolerant operating method is applied to the fault-tolerant system 100A. The process starts at step S700.

In step S700, the fault-tolerant system 100A determines whether the calculation unit 102 has received one of a plurality of instructions IS1-ISN. For example, the instructions IS1-ISN can represent combinations of addition, subtraction, multiplication and/or division, but it is not limited thereto. For purposes of simplifying the descriptions of the embodiments, hereinafter one of the instructions IS1-ISN which is received by the calculation unit 102 is referred to as the first instruction. When the fault-tolerant system 100A determines that the calculation unit 102 has received the first instruction of the instructions IS1-ISN, the process goes to step S702, otherwise, the fault-tolerant system 100A continues to determine whether the calculation unit 102 has received one of a plurality of instructions IS1-ISN.

Next, in step S702, the first calculation circuit 1021' of the first calculation module 1021 performs a calculation on the input data DA1 according to the first instruction and in response to a first environmental parameter of a plurality of environmental parameters to generate a first calculation result RS1, wherein the first calculation result RS1 is constituted by a plurality of first output bits, and each of the first output bits has a corresponding bit position. The second calculation circuit 1022' of the second calculation module 1022 performs the calculation on the input data DA1 in response to the first environmental parameter and the first instruction to generate a second calculation result RS2, wherein the second calculation result RS2 is constituted by a plurality of second output bits, and each of the second output bits has a corresponding bit position. For example, the environmental parameters can represent operation voltages with different voltage levels, operation temperatures with different degrees, and/or the clock signals with different speed arranged to be provided to the calculation unit 102 for calculating. The first calculation module 1021 and the second calculation module 1022 apply different hardware circuits to perform the calculation indicated by the first instruction on the input data DA1 in response to the first environmental parameter. For example, the implementations of the first calculation module 1021 and the second calculation module 1022 are different. In another embodiment, the first calculation circuit 1021' of the first calculation module 1021 can perform the calculation on the input data DA1 in response to the first environmental parameter to generate a first calculation result RS1 without the first instruction. The second calculation circuit 1022' of the second calculation module 1022 can perform the calculation on the input data DA1 according to the first environmental parameter to generate a first calculation result RS1 without the first instruction. Namely, the first calculation module 1021 and the second calculation module 1022 do not need to receive the first instruction in this embodiment. In another embodiment, the first calculation module 1021 and the second calculation module 1022 can also apply different circuits to perform the calculation indicated by the first instruction on the input data DA1 in response to the first environmental parameter, but it is not limited thereto.

Next, in step S706, the output controller 106 is arranged to generate the control signal CS1 according to the first instruction, the first environmental parameter, a first circuit-characteristics table of the first calculation circuit 1021' and a second circuit-characteristics table of the second calculation circuit 1022', and transmit the control signal CS1 to the output synthesizer 104. The first circuit-characteristics table is arranged to record the accuracies of each bit position output by the first calculation circuit 1021' with the environmental parameters and the instructions IS1-ISN, and the second circuit-characteristics table is arranged to record the accuracies of each bit position output by the second calculation circuit 1022' with the environmental parameters and the instruction IS1 -ISN, but it is not limited thereto. In one of the embodiments, the output controller 106 is arranged to select the first output bits or the second output bits with the higher accuracy from the first circuit-characteristics table and the second circuit-characteristics table for each bit position according to the first instruction and the first environmental parameter to produce the control signal CS1. The developer can obtain the accuracies of each of the bits output by the first calculation circuit 1021' corresponding to the different environmental parameters and the different instructions IS1-ISN by testing the first calculation circuit 1021' repeatedly according to the different environmental parameters and the different instructions IS1-ISN for producing the first circuit-characteristics table accordingly. Similarly, the developer can obtain the accuracies of each of the bits output by the second calculation circuit 1022' corresponding to the different environmental parameters and the different instructions IS1-ISN by testing the second calculation circuit 1022' repeatedly according to the different environmental parameters and the different instructions IS1-ISN for producing the second circuit-characteristics table accordingly. In another embodiment, the output controller 106 is arranged to produce the control signal CS1 according to the first instruction and the 0.85 factor of the first operation voltage, and transmit the control signal CS1 to the output synthesizer 104. Namely, the control signal CS1 includes information about the first instruction and the first environmental parameter, wherein the first instruction indicates the addition calculation. The details of step S706 can be referred to in the descriptions of FIGS. 2A-2C and FIG. 3.

Next, in step S708, the output synthesizer 104 selects a first set of bits from the first output bits and a second set of bits from the second output bits according to a control signal CS1. The details of step S708 can be referred to in the descriptions of FIGS. 2A-2C and FIG. 3.

Next, in step S710, the output synthesizer 104 synthesizes the first set of bits and the second set of bits in sequence to generate an adjusted calculation result ARS according to the corresponding bit positions of the first set of bits in the first output bits and the second set of bits in the second output bits. The first calculation result RS1, the second calculation result RS2 and the adjusted calculation result ARS have the same number of bits, and the corresponding bit positions of the first set of bits in the first output bits are different from the corresponding bit positions of the second set of bits in the second output bits. The details of step S710 can be referred to in the descriptions of FIGS. 2A-2C and FIG. 3. Next, the process returns to step S700, and the fault-tolerant system 100A continues to determine whether the calculation unit 102 has received one of the instructions IS1-ISN.

Figure 8:
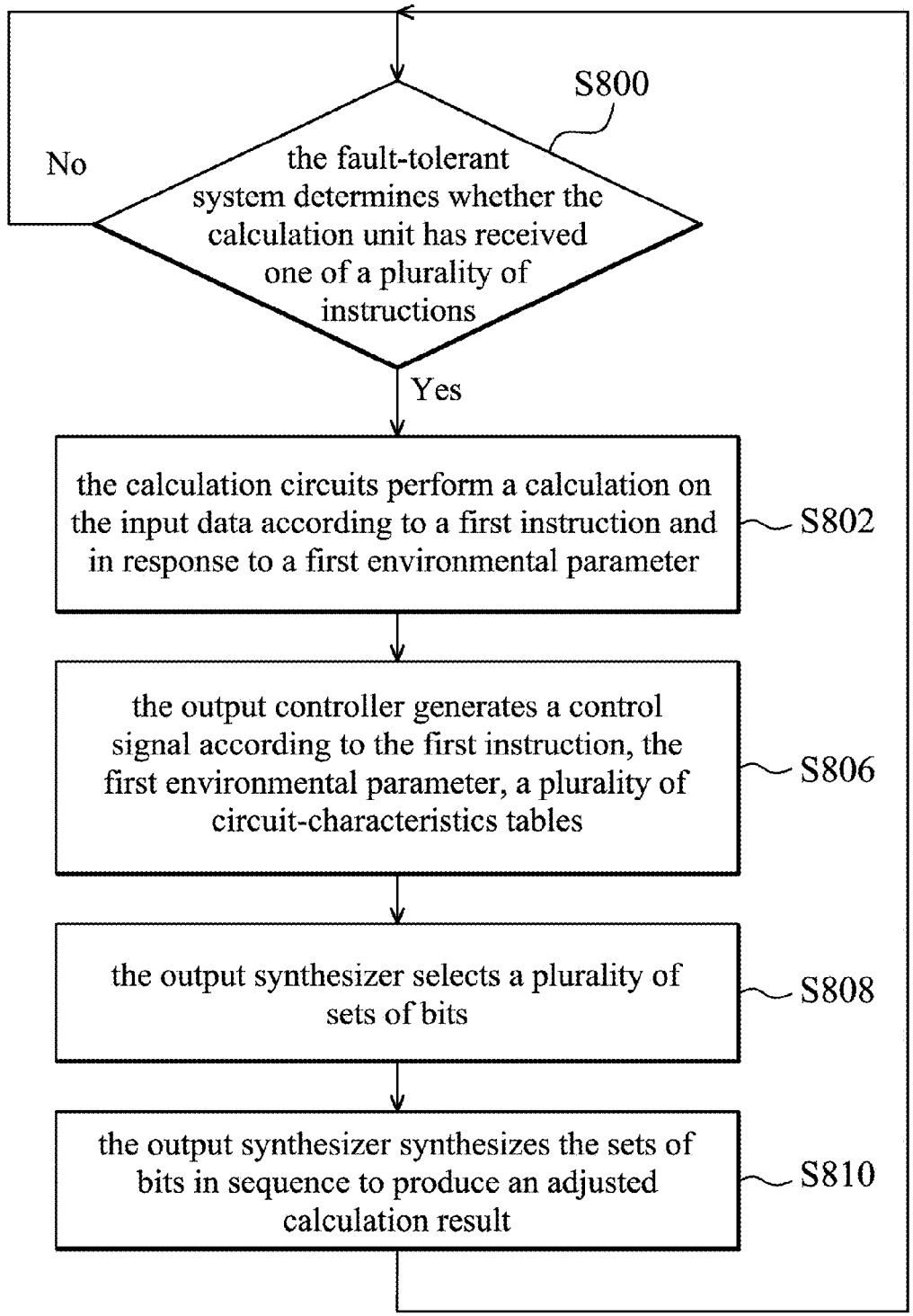
FIG. 8 is a flowchart of a fault-tolerant operating method according to another exemplary embodiment.

FIG. 8 is a flowchart of a fault-tolerant operating method according to another exemplary embodiment. The fault-tolerant operating method is applied to the fault-tolerant system 100B. The process starts at step S800.

In step S800, the fault-tolerant system 100B determines whether the calculation unit 102 has received one of a plurality of instructions IS1-ISN. For example, the instructions IS1-ISN can represent combinations of addition, subtraction, multiplication and/or division, but it is not limited thereto. For purposes of simplifying the descriptions of the embodiments, hereinafter the one of the instructions IS1-ISN received by the calculation unit 102 is referred to as the first instruction. When the fault-tolerant system 100B determines that the calculation unit 102 has received the first instruction of the instructions IS1-ISN, the process goes to step S802, otherwise, the fault-tolerant system 100B continues to determine whether the calculation unit 102 has received one of a plurality of instructions IS1-ISN.

Next, in step S802, the first calculation circuit 1021'~the Nth calculation circuit 102N' are arranged to perform the calculation on the input data DA1 according to a first instruction and in response to a first environmental parameter of a plurality of environmental parameters to generate the first calculation result RS1~the Nth calculation result RSN, respectively, wherein the first calculation result RS1~the Nth calculation result RSN are constituted by a plurality of output bits, respectively, and each of the output bits of the first calculation result RS1~the Nth calculation result RSN has a corresponding bit position. For example, the environmental parameters can represent operation voltages with different voltage levels, operation temperatures with different degrees, and/or the clock signals with different speed arranged to be provided to the calculation unit 102 for calculating. The first calculation module 1021~the Nth calculation module 102N apply different hardware circuits to perform the calculation indicated by the first instruction on the input data DA1 in response to the first environmental parameter. For example, the implementations of the first calculation module 1021 and the second calculation module 1022 are different. In another embodiment, the first calculation circuit 1021' of the first calculation module 1021~the Nth calculation circuit 102N' of the Nth calculation module 102N can perform the calculation on the input data DA1 in response to the first environmental parameter to generate the first calculation result RS1~the Nth calculation result RSN without the first instruction. Namely, the first calculation module 1021~the Nth calculation module 102N do not need to receive the first instruction in this embodiment. In another embodiment, the first calculation module 1021~the Nth calculation module 102N can also apply different circuits to perform the calculation indicated by the first instruction on the input data DA1 in response to the first environmental parameter, but it is not limited thereto.

Next, in step S806, the output controller 106 is arranged to generate the control signal CS1 according to the first instruction, the first environmental parameter, and the first circuit-characteristics table~the Nth circuit-characteristics table corresponding to the first calculation circuit 1021'~the Nth calculation circuit 102N', and transmit the control signal CS1 to the output synthesizer 104. The first circuit-characteristics table~the Nth circuit-characteristics table are arranged to record the accuracies of each bit position output by the first calculation circuit 1021'~the Nth calculation circuit 102N' with the environmental parameters and the instructions IS1-ISN, respectively. In one of the embodiments, the output controller 106 is arranged to select the output bits with the higher accuracy from the first circuit-characteristics table~the Nth circuit-characteristics table corresponding to the first calculation circuit 1021'~the Nth calculation circuit 102N' for each bit position according to the first instruction and the first environmental parameter to produce the control signal CS1. The developer can obtain the accuracies of each of the bits output by the first calculation circuit 1021'~the Nth calculation circuit 102N' corresponding to the different environmental parameters and the different instructions IS1-ISN by testing the first calculation circuit 1021'~the Nth calculation circuit 102N' repeatedly according to the different environmental parameters and the different instructions IS1-ISN for producing the first circuit-characteristics table—the Nth circuit-characteristics table accordingly. In another embodiment, the output controller 106 is arranged to produce the control signal CS1 according to the first instruction and the 0.85 factor of the first operation voltage, and transmit the control signal CS1 to the output synthesizer 104, wherein the first instruction indicates the addition calculation. Namely, the control signal CS1 includes information about the first instruction and the first environmental parameter. The details of step S806 can be referred to in the descriptions of FIGS. 2A-2C and FIG. 3.

Next, in step S808, the output synthesizer 104 selects a plurality of sets of bits from the output bits produced by the first calculation circuit 1021'~the Nth calculation circuit 102N' according to the control signal CS1. The details of step S808 can be referred to in the descriptions of FIGS. 2A-2C and FIG. 3.

Next, in step S810, the output synthesizer 104 synthesizes the output bits of the selected sets of bits in sequence according to the corresponding bit positions of the output bits to generate an adjusted calculation result ARS. The first calculation result RS1-RSN and the adjusted calculation result ARS have the same number of bits are equal, and the corresponding bit positions of the selected sets of bits are different from each other. The details of step S810 can be referred to in the descriptions of FIGS. 2A-2C and FIG. 3. Next, the process returns back to step S800, and the fault-tolerant system 100B continues to determine whether the calculation unit 102 has received one of the instructions IS1-ISN.

Figure 9A:
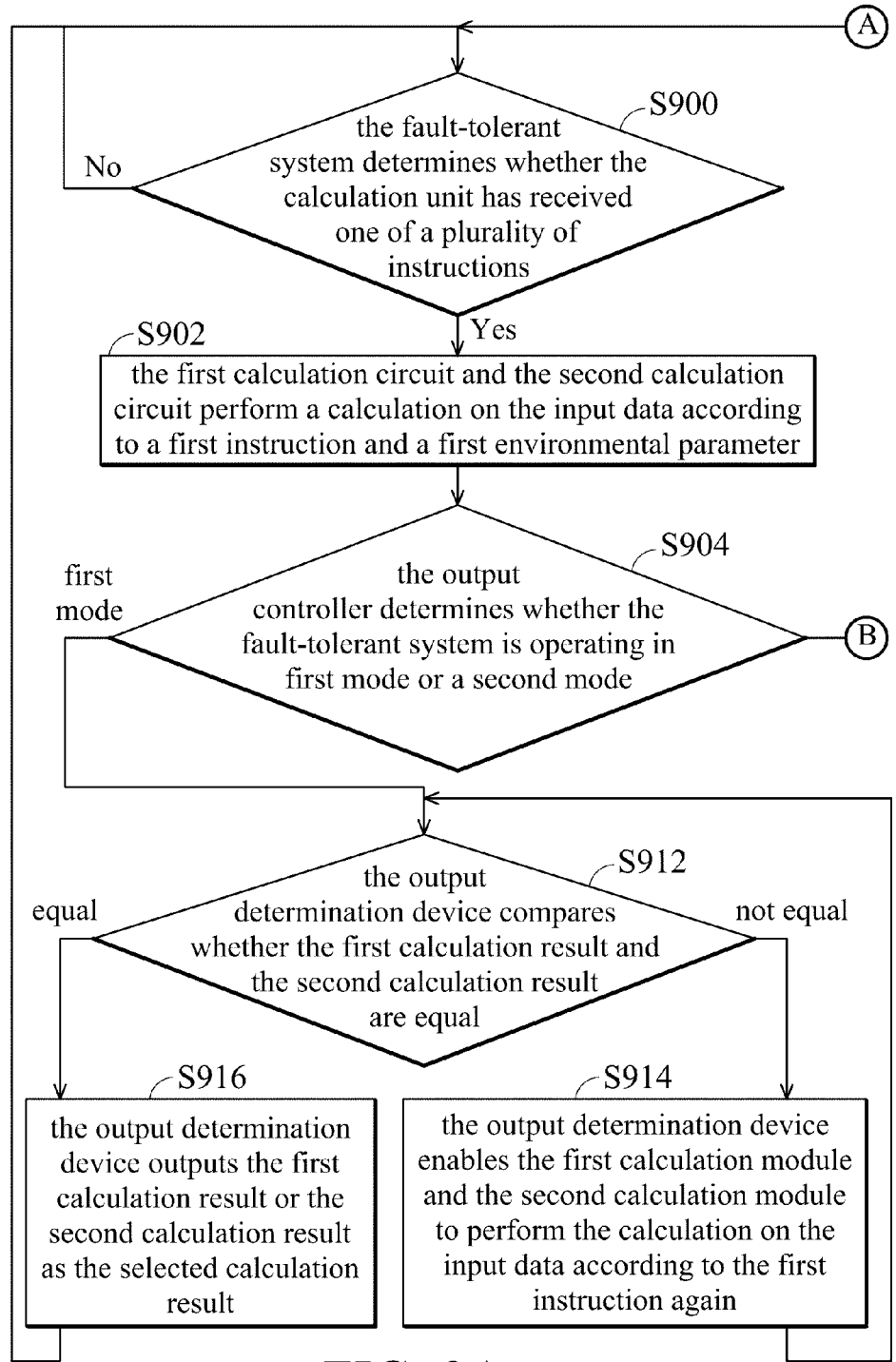
FIGS. 9A-9B are a flowchart of a fault-tolerant operating method according to another exemplary embodiment.
Figure 9B:
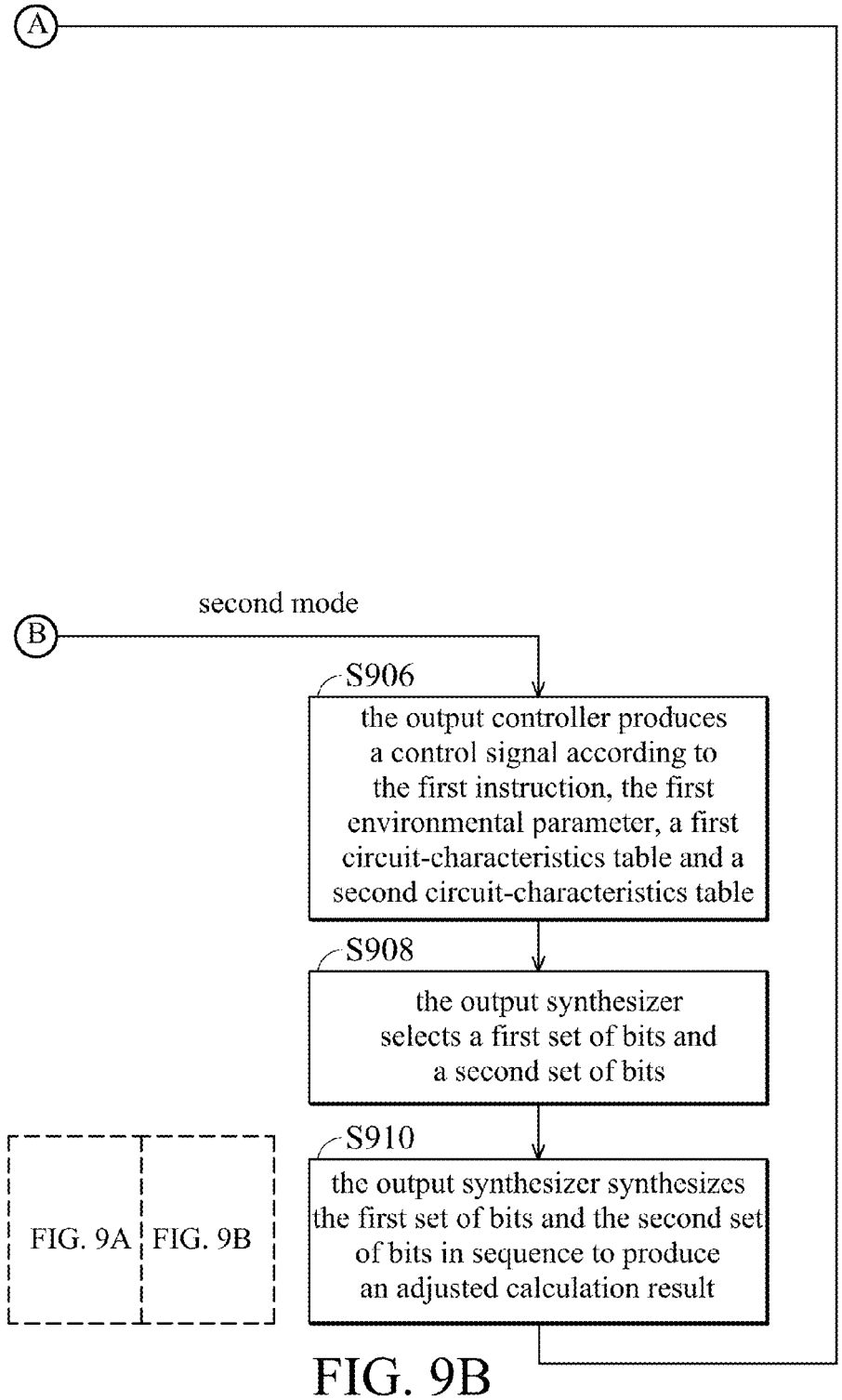

FIGS. 9A-9B are a flowchart of a fault-tolerant operating method according to another exemplary embodiment, wherein the fault-tolerant operating method is applied to fault-tolerant system 100C. The process starts at step S900. Steps S900-S902 and S906-S910 are similar to steps S700-S702 and S706-S710 of FIG. 7. Therefore, the details of steps S900-S902 and S906-S910 can be referred to in FIG. 7.

In step S904, the output controller 106 is further arranged to determine whether the fault-tolerant system 100C is operating in first mode or a second mode according to the determination signal S3 arranged to indicate the operation mode. In one embodiment, the first mode is a normal operation mode and the second mode is a digital processing mode, but it is not limited thereto. When the operation mode is the normal operation mode (the first mode), the output controller 106 enables the output determination device 108 and the process goes to step S912. When the operation mode is the digital processing mode (the second mode), the output controller 106 enables the output synthesizer 104 and the process goes to step S906.

In step S912, the output determination device 108 is further arranged to compare whether the first calculation result RS1 and the second calculation result RS2 are equal. When the first calculation result RS1 and the second calculation result RS2 are not equal, the process goes to step S914. When the first calculation result RS1 and the second calculation result RS2 are equal, the process goes to step S916.

In step S914, the output determination device 108 enables the first calculation module 1021 and the second calculation module 1022 to perform the calculation on the input data DA1 according to the first instruction again. For example, when the first calculation result RS1 and the second calculation result RS2 are not equal, the output determination device 108 produces a control signal CS2, and transmits the control signal CS2 to the calculation unit 102. The first calculation module 1021 and the second calculation module 1022 of the calculation unit 102 perform the calculation on the input data DA1 according to the first instruction again after receiving the control signal CS2. In another embodiment, the first calculation module 1021 and the second calculation module 1022 can perform the calculation on the input data DA1 in step S914. Namely, the first calculation module 1021 and the second calculation module 1022 are arranged to perform the calculation on the input data DA1 without receiving the first instruction. Next, the process returns to step S912, and the output determination device 108 compares whether the re-calculated first calculation result RS1 and the second calculation result RS2 are equal.

In step S916, the output determination device 108 outputs the first calculation result RS1 or the second calculation result RS2 as the selected calculation result SRS. Next, the process returns back to step S900, and the fault-tolerant system 100C continues to determine whether the calculation unit 102 has received one of the instructions IS1-ISN. The details of step S916 can be referred to in the descriptions of FIG. 1-3.

Figure 10A:
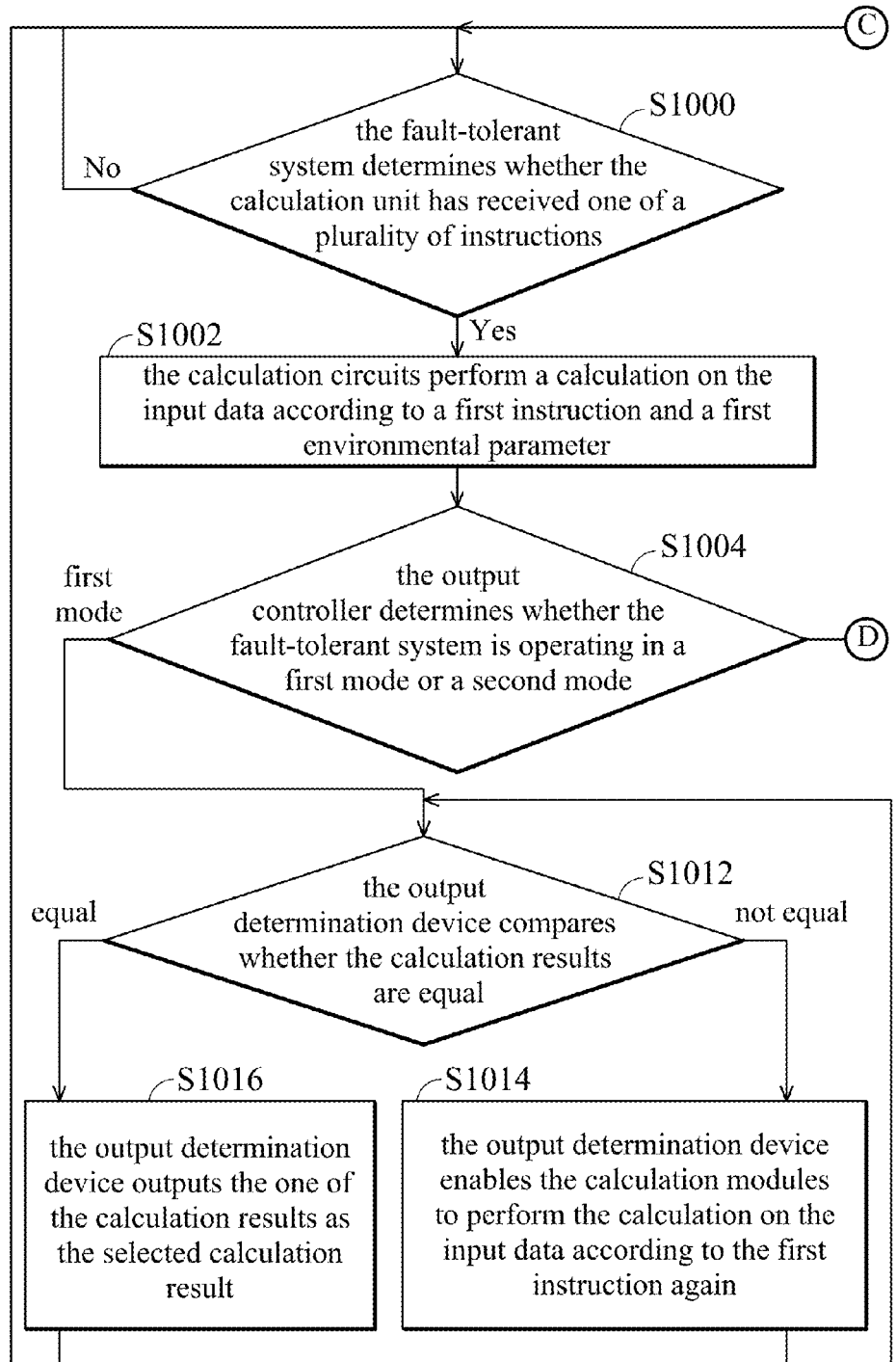
FIGS. 10A-10B are a flowchart of a fault-tolerant operating method according to another exemplary embodiment.
Figure 10B:
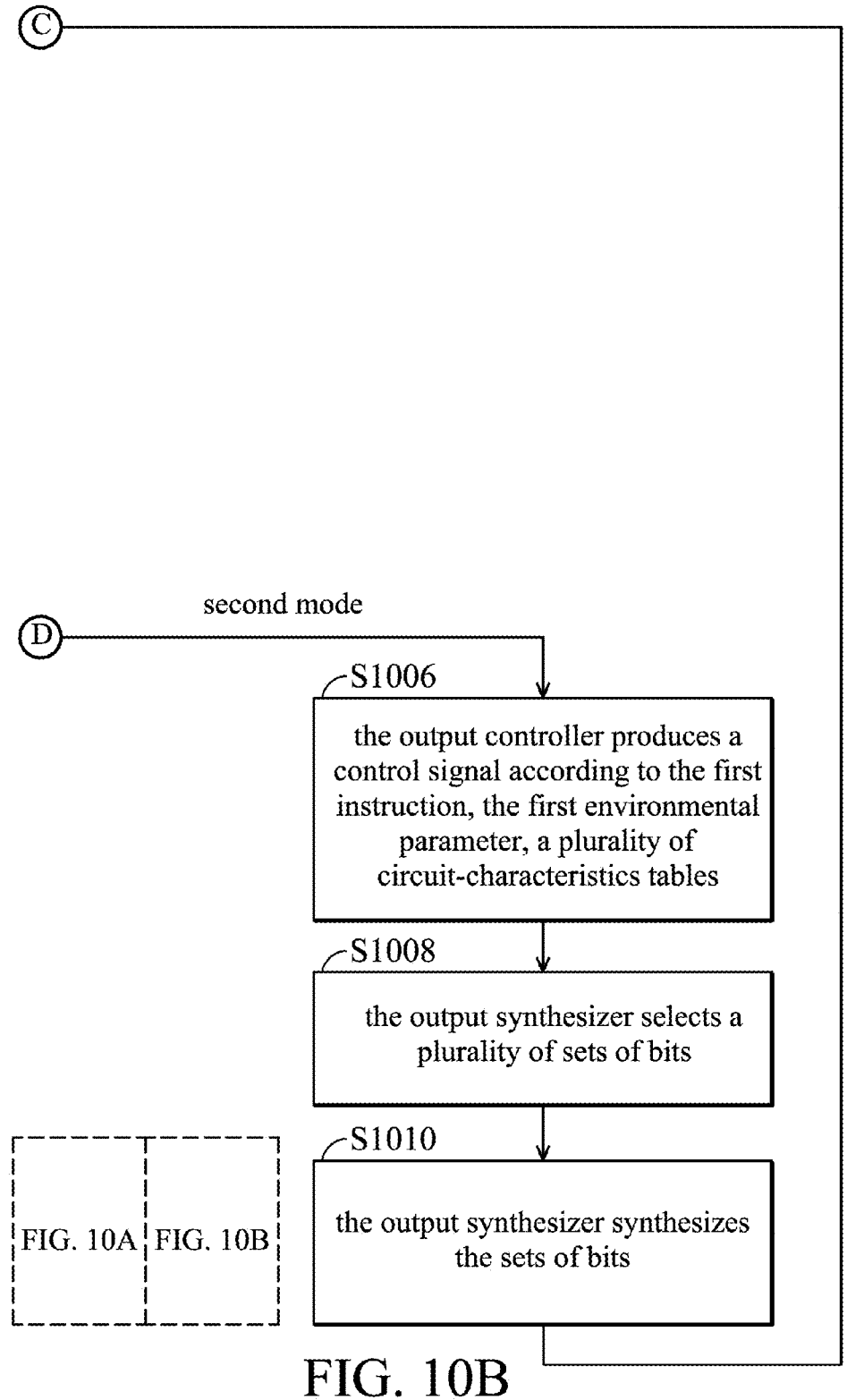

FIGS. 10A-10B are a flowchart of a fault-tolerant operating method according to another exemplary embodiment, wherein the fault-tolerant operating method is applied to the fault-tolerant system 100D. The process starts at step S1000. Steps S1000-S1002 and S1006-S1010 are similar to steps S800-S802 and S806-S810 of FIG. 8. Therefore, refer to FIG. 8 for details of steps S1000-S1002 and S1006-S1010.

In step S1004, the output controller 106 is further arranged to determine whether the fault-tolerant system 100D is operating in a first mode or a second mode according to the determination signal S3 arranged to indicate the operation mode. In one embodiment, the first mode is a normal operation mode and the second mode is a digital processing mode, but it is not limited thereto. When the operation mode is the normal operation mode (the first mode), the output controller 106 enables the output determination device 108 and the process goes to step S1012. When the operation mode is the digital processing mode (the second mode), the output controller 106 enables the output synthesizer 104 and the process goes to step S1006.

In step S1012, the output determination device 108 is further arranged to compare whether the first calculation result RS1~the Nth calculation result RSN are equal. When the first calculation result RS1~the Nth calculation result RSN are not equal, the process goes to step S1014. When the first calculation result RS1~the Nth calculation result RSN are equal, the process goes to step S1016.

In step S1014, the output determination device 108 enables the first calculation module 1021~the Nth calculation module 102N to perform the calculation on the input data DA1 according to the first instruction again. For example, when the first calculation result RS1 and the second calculation result RS2 are not equal, the output determination device 108 produces a control signal CS2, and transmits the control signal CS2 to the calculation unit 102. The first calculation module 1021~the Nth calculation module 102N of the calculation unit 102 perform the calculation on the input data DA1 according to the first instruction again after receiving the control signal CS2. In another embodiment, the first calculation module 1021~the Nth calculation module 102N can perform the calculation on the input data DA1 in step S1014. Namely, the first calculation module 1021~the Nth calculation module 102N are arranged to perform the calculation on the input data DA1 without receiving the first instruction. Next, the process returns to step S1012, the output determination device 108 compares whether the re-calculated first calculation result RS1~the Nth calculation result RSN are equal.

In step S1016, the output determination device 108 outputs one of the first calculation result RS1~the Nth calculation result RSN as the selected calculation result SRS. Next, the process returns to step S1000, the fault-tolerant system 100D continues to determine whether the calculation unit 102 has received one of the instructions IS1-ISN. The details of step S1016 can be referred in to the descriptions of FIG. 1-3.

The fault-tolerant systems 100A-100D and the fault-tolerant operating method of the embodiments are arranged to select and synthesize the correct output bits to generate the adjusted calculation result ARS according to different environmental parameters, such as operation voltage, operation temperature, clock speed, etc. The fault-tolerant systems 100A-100D and the fault-tolerant operating method of the embodiments can further output the result with higher accuracy and speed, and reduce the re-counting time of the traditional fault-tolerant system with the Lock-step dual-core to save power and enhance performance.

Data transmission methods, portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A fault-tolerant system, comprising:
 a calculation unit, arranged to receive input data and a first instruction, wherein the calculation unit further comprises:
  a first calculation module, comprising a first calculation circuit arranged to perform a calculation on the input data to generate a first calculation result, wherein the first calculation result is constituted by a plurality of first output bits, and each of the first output bits has a corresponding bit position, wherein the first calculation circuit is affected by a first environmental parameter; and
  a second calculation module, comprising a second calculation circuit different from the first calculation circuit, and the second calculation circuit is arranged to perform the calculation on the input data to generate a second calculation result, wherein the second calculation result is constituted by a plurality of second output bits, and each of the second output bits has a corresponding bit position, wherein the second calculation circuit is affected by the first environmental parameter;

an output synthesizer, arranged to select a first set of bits from the first output bits and a second set of bits from the second output bits according to a control signal, and synthesize the first set of bits and the second set of bits in sequence according to the corresponding bit positions of the first set of bits in the first output bits and the second set of bits in the second output bits to generate an adjusted calculation result; and an output controller arranged to produce the control signal according to the first instruction, the first environmental parameter, a first circuit-characteristics table of the first calculation circuit and a second circuit-characteristics table of the second calculation circuit.

2. The fault-tolerant system as claimed in claim 1, wherein the first calculation result, the second calculation result and the adjusted calculation result have the same number of bits, and the corresponding bit positions of the first set of bits in the first output bits are different from the corresponding bit positions of the second set of bits in the second output bits.

3. The fault-tolerant system as claimed in claim 1, wherein the output controller further comprises a storage device arranged to store the first circuit-characteristics table and the second circuit-characteristics table, wherein the first circuit-characteristics table is arranged to record a relationship of each bit position output by the first calculation circuit with a plurality of environmental parameters and the first instruction, and the second circuit-characteristics table is arranged to record a relationship of each bit position output by the second calculation circuit with the environmental parameters and the first instruction, wherein the environmental parameters comprises the first environmental parameter.

4. The fault-tolerant system as claimed in claim 3, wherein the output controller is arranged to select the first output bits or the second output bits for each bit position according to the first instruction and the first environmental parameter to produce the control signal, wherein the output controller is arranged to select one of the first output bits or the second output bits with higher accuracy based on the first circuit-characteristics table and the second circuit-characteristics table.

5. The fault-tolerant system as claimed in claim 1, further comprising an output determination device arranged to compare the first calculation result and the second calculation result, wherein the output determination device is arranged to enable the first calculation module and the second calculation module to perform the calculation on the input data in response to the first instruction again when the first calculation result and the second calculation result are different, and the output determination device is arranged to output the first calculation result or the second calculation result when the first calculation result and the second calculation result are equal.

6. The fault-tolerant system as claimed in claim 5, wherein the output controller is further arranged to enable the output synthesizer or the output determination device according to an operation mode.

7. The fault-tolerant system as claimed in claim 6, wherein the operation mode comprises a first mode and a second mode, the output controller is arranged to enable the output determination device when the operation mode is the first mode, and the output controller is arranged to enable the output synthesizer when the operation mode is the second mode.

8. The fault-tolerant system as claimed in claim 1, wherein the first environmental parameter comprises operation voltage, operation temperature or clock signal speed, and the first calculation circuit and the second calculation circuit are further arranged to perform the calculation on the input data in response to the first instruction received by the calculation unit to generate the first calculation result and the second calculation result, respectively.

9. A fault-tolerant operating method, applied for a fault-tolerant system, comprising:

performing a calculation on input data to generate a first calculation result by a first calculation circuit affected by a first environmental parameter, wherein the first calculation result is constituted by a plurality of first output bits, and each of the first output bits has a corresponding bit position;

performing the calculation on the input data to generate a second calculation result by a second calculation circuit which is affected by the first environmental parameter and different from the first calculation circuit, wherein the second calculation result is constituted by a plurality of second output bits, and each of the second output bits has a corresponding bit position;

selecting a first set of bits from the first output bits and a second set of bits from the second output bits according to a control signal; and synthesizing the first set of bits and the second set of bits in sequence according to the corresponding bit positions of the first set of bits in the first output bits and the second set of bits in the second output bits to generate an adjusted calculation result, wherein the step of generating the first calculation result further comprises performing the calculation on the input data in response to a first instruction of a plurality of instructions by the first calculation circuit, and the step of generating the second calculation result further comprises performing the calculation on the input data in response to the first instruction by the second calculation circuit, wherein the fault-tolerant operating method further comprises:

producing the control signal according to the first instruction, the first environmental parameter, a first circuit-characteristics table of the first calculation circuit and a second circuit-characteristics table of the second calculation circuit.

10. The fault-tolerant operating method as claimed in claim 9, wherein the first calculation result, the second calculation result and the adjusted calculation result have the same number of bits, and the corresponding bit positions of the first set of bits in the first output bits are different from the corresponding bit positions of the second set of bits in the second output bits.

11. The fault-tolerant operating method as claimed in claim 9, wherein the first circuit-characteristics table is arranged to record a relationship of each bit position output by the first calculation circuit, a plurality of environmental parameters and the instructions, and the second circuit-characteristics table is arranged to record a relationship of each bit position output by the second calculation circuit, the environmental parameters and the instructions, wherein the environmental parameters comprises the first environmental parameter.

12. The fault-tolerant operating method as claimed in claim 11, wherein the step of producing the control signal further comprises selecting the first output bits or the second output bits for each bit position according to the first instruction and the first environmental parameter to produce the control signal, wherein the step of selecting the first output bits or the second output bits is selecting the first output bits or the second output bits with higher accuracy based on the first circuit-characteristics table and the second circuit-characteristics table.

13. The fault-tolerant operating method as claimed in claim 9, further comprising determining an operation mode, wherein the step of synthesizing the first set of bits and the second set of bits in sequence according to the corresponding bit positions of the first set of bits in the first output bits and the second set of bits in the second output bits to generate the adjusted calculation result is performed when the operation mode is a second mode.

14. The fault-tolerant operating method as claimed in claim 13, further comprising:
    comparing the first calculation result and the second calculation result when the operation mode is a first mode;
    performing the calculation on the input data in response to the first instruction by the first calculation circuit and the second calculation circuit again when the first calculation result and the second calculation result are different; and
    outputting the first calculation result or the second calculation result when the first calculation result and the second calculation result are equal, wherein the step of synthesizing the first set of bits and the second set of bits in sequence according to the corresponding bit positions of the first set of bits in the first output bits and the second set of bits in the second output bits to generate the adjusted calculation result is disabled when the operation mode is the first mode.

15. The fault-tolerant operating method as claimed in claim 9, wherein the first environmental parameter comprises operation voltage, operation temperature or clock signal speed.

* * * * *